United States Patent
Lee et al.

(10) Patent No.: US 6,890,598 B2
(45) Date of Patent: May 10, 2005

(54) DITHIOCARBOXLIC ACID SELF-ASSEMBLED MONOLAYERS AND METHODS FOR USING SAME IN MICROCONACT PRINTING

(76) Inventors: Randall T. Lee, 7447 Cambridge #100, Houston, TX (US) 77204-2163; Ramon Colorado, Jr., 5104 Irving Way, Houston, TX (US) 77087

( * ) Notice: Subject to any disclaimer, the term of this patent is extended or adjusted under 35 U.S.C. 154(b) by 0 days.

(21) Appl. No.: 10/471,066
(22) PCT Filed: Mar. 6, 2002
(86) PCT No.: PCT/US02/06481
§ 371 (c)(1), (2), (4) Date: Sep. 5, 2003
(87) PCT Pub. No.: WO02/071151
PCT Pub. Date: Sep. 12, 2002

(65) Prior Publication Data
US 2004/0137148 A1 Jul. 15, 2004

Related U.S. Application Data
(60) Provisional application No. 60/273,617, filed on Mar. 6, 2001.

(51) Int. Cl.[7] .............................................. B05D 3/06
(52) U.S. Cl. .................... 427/264; 427/553; 427/271
(58) Field of Search ................................ 427/256, 258, 427/261, 264, 271, 273, 553, 595

(56) References Cited

PUBLICATIONS

Xia et al., "Pattern transfer: Self–assembled monlayers as ultrathin resists," Microelectronic Engineering 32 (1996) 255–268.*

Shon et al., "Self–Assembled Monolayers Derived from Bidentate Organosulfur Adsorbates," Mat. Res. Soc. Symp. Proc. vol. 576 183–188.*

* cited by examiner

Primary Examiner—Bret Chen
Assistant Examiner—William Phillip Fletcher, III
(74) Attorney, Agent, or Firm—Robert W. Strozier (57) ABSTRACT

Aliphatic dithiocarboxylic acid compositions (ADTCAs) that form self-assembled monolayers (SAMs) on metal surface such as gold surfaces are disclosed. These new SAMs were characterized by optical ellipsometry, contact angle goniometry, and polarization modulation infrared reflection absorption spectroscopy (PM-IRRAS). The data indicates that the ADTCAs generate well packed and highly oriented monolayer films on gold surfaces. A method for using the ADTCAs in micro-contact printing is also disclosed, where ADTCA SAM protected regions are capable of more efficient cleaning under mild conditions due to instabilities in the ADTCA compositions.

19 Claims, 4 Drawing Sheets

DITHIOCARBOXLIC ACID SELF-ASSEMBLED MONOLAYERS AND METHODS FOR USING SAME IN MICROCONACT PRINTING

RELATED APPLICATIONS

This application is a 35 U.S.C. § 371 National Phase Application of PCT/US02/06481 filed 6 Mar. 2002, which claims provisional priority to United States Provisional Patent Application Ser. No. 60/273,617, filed 6 Mar. 2001.

BACKGROUND OF THE INVENTION

1. Field of the Invention

The present invention relates to a method for micro-contacting printing using self-assembled monolayers (SAMs) of dithiocarboxylic acids (DTCAs) and to patterned substrate formed thereby.

More particularly, the present invention relates to a method for micro-contacting printing using self-assembled monolayers (SAMs) of dithiocarboxylic acids (DTCAs) involving contacting a substrate surface with a patterned template where regions of the template are coated with a aliphatic dithiocarboxylic acid to form a pattern on the substrate surface of regions having a SAM of the DTCA and regions void of a SAM of the DTCA, depositing a material onto the patterned substrate, removing excess material and exposing the resulting patterned substrate to ambient conditions for a period of time sufficient to result in the decomposition of the DTCA SAM regions.

2. Description of the Related Art

Self-assembled monolayers (SAMs) are continuing to draw widespread interest because of their potential use in technological applications.[1] Some areas of current interest include adhesion promotion/resistance,[2,3] biomaterials fabrication,[4-7] corrosion resistance,[8,9] lithographic patterning,[10,11] and microelectronics fabrication.[12,13] The most thoroughly examined SAMs are those generated by the adsorption of alkanethiols on gold. Their popularity can be attributed to the ease with which they can be prepared, manipulated, and characterized.[14-17] When adsorbed from solution onto gold, alkanethiols form close-packed essentially defect-free monolayer films. The sulfur atoms bind to the threefold hollow sites of Au(111) with the alkyl chains tilting approximately 30° from the normal to the surface. The overlayer structure is characterized by a (√3×√3)R 30° orientation.18,19

The structural features of SAMs on gold are dictated by two major factors: the thiol-gold interaction and the interchain interactions.14–17 The adsorbates bind to the threefold hollows to maximize the binding of sulfur to gold (see FIG. 1a); the chains tilt to maximize the interchain attractions.20,21 Consequently, we felt that it might be possible to influence the structural features of SAMs on gold by changing the nature of the binding of the adsorbate to the hexagonal lattice of gold. Specifically targeted chelating adsorbates, for example, in which the sulfur atoms are restricted in their ability to bind to the threefold hollows might generate SAMs with equilibrium structures that are different from normal alkanethiol-based SAMs. Indeed, SAMs on gold have been generated from at least two such species: aliphatic dithiocarbamates and xanthates,22,23 assuming that both sulfur atoms in the head group attach to the surface of gold (see FIG. 1b).24 To our knowledge, however, there has been no systematic comparison of the SAMs generated from these species to those generated from their normal alkanethiol analogs.

Thus, there is a need in the art for a method for micro-contacting printing where the regions to be protected are composed of SAMs of compounds that are oxidatively liable affording improved performance, lower cost and better products.

SUMMARY OF THE INVENTION

The present invention provides a method for micro-contacting printing including:

printing a pattern on a surface of a substrate, where the pattern includes exposed regions and self-assembled monolayer (SAM) protected regions, where the SAM comprises a dithiocarboxylic acid (DTCA) of the general formula (I):

$$(R)_\alpha - R' - (CS_2H)_\beta \qquad (I)$$

where:
R is a carbon-containing group, a fluorinated carbon-containing group or a fluorocarbon-containing group;
R' is a carbon-containing group, a multivalent atom, a double bond or hetero atom analog, a saturated, unsaturated, aromatic ring system or a hetero atom analog; and
α and β are integers the sum of which is less than a maximum number of substituents R' can accommodate to form a relatively stable molecular species, with all other sites being occupied by hydrogen atoms.

The present invention provides a method for micro-contacting printing including:

printing a pattern on a top surface of a substrate including a base layer and a top layer, where the pattern includes exposed regions and self-assembled monolayer (SAM) protected regions, where the SAM comprises a dithiocarboxylic acid (DTCA) of the general formula (I):

$$(R)_\alpha - R' - (CS_2H)_\beta \qquad (I)$$

where:
R is a carbon-containing group, a fluorinated carbon-containing group or a fluorocarbon-containing group;
R' is a carbon-containing group, a multivalent atom, a double bond or hetero atom analog, a saturated, unsaturated, aromatic ring system or a hetero atom analog; and
α and β are integers the sum of which is less than a maximum number of substituents R' can accommodate to form a relatively stable molecular species, with all other sites being occupied by hydrogen atoms.

The present invention provides a method for micro-contacting printing including:

printing a pattern on a top surface of a substrate including a base layer and a top layer, where the pattern includes exposed regions and self-assembled monolayer (SAM) protected regions, where the SAM comprises a dithiocarboxylic acid (DTCA) of the general formula (I):

$$(R)_\alpha - R' - (CS_2H)_\beta \qquad (I)$$

where:
R is a carbon-containing group, a fluorinated carbon-containing group or a fluorocarbon-containing group;

R' is a carbon-containing group, a multivalent atom, a double bond or hetero atom analog, a saturated, unsaturated, aromatic ring system or a hetero atom analog; and α and β are integers the sum of which is less than a maximum number of substituents R' can accommodate to form a relatively stable molecular species, with all other sites being occupied by hydrogen atoms; and removing the top layer from the exposed regions.

The present invention provides a method for microcontacting printing including:

printing a pattern on a top surface of a substrate including a base layer and a top layer, where the pattern includes exposed regions and self-assembled monolayer (SAM) protected regions, where the SAM comprises a dithiocarboxylic acid (DTCA) of the general formula (I):

$$(R)_\alpha\text{---}R'\text{---}(CS_2H)_\beta \qquad (I)$$

where:
R is a carbon-containing group, a fluorinated carbon-containing group or a fluorocarbon-containing group;
R' is a carbon-containing group, a multivalent atom, a double bond or hetero atom analog, a saturated, unsaturated, aromatic ring system or a hetero atom analog; and
α and β are integers the sum of which is less than a maximum number of substituents R' can accommodate to form a relatively stable molecular species, with all other sites being occupied by hydrogen atoms; and removing the top layer from the exposed regions; and coating the patterned substrate surface with a composition to form a patterned substrate including a covering layer.

The present invention provides a method for microcontacting printing including:

printing a pattern on a top surface of a substrate including a base layer and a top layer, where the pattern includes exposed regions and self-assembled monolayer (SAM) protected regions, where the SAM comprises a dithiocarboxylic acid (DTCA) of the general formula (I):

$$(R)_\alpha\text{---}R'\text{---}(CS_2H)_\beta \qquad (I)$$

where:
R is a carbon-containing group, a fluorinated carbon-containing group or a fluorocarbon-containing group;
R' is a carbon-containing group, a multivalent atom, a double bond or hetero atom analog, a saturated, unsaturated, aromatic ring system or a hetero atom analog; and
α and β are integers the sum of which is less than a maximum number of substituents R' can accommodate to form a relatively stable molecular species, with all other sites being occupied by hydrogen atoms; and removing the top layer from the exposed regions;

coating the patterned substrate surface with a composition to form a covering layer;

repeating the printing, removing and coating step to form substrate comprising multiple patterned layers separated a covering layer.

The present invention provides a method for microcontacting printing including:

contacting a substrate with a stamp comprising a patterned surface coated with a dithiocarboxylic acid (DTCA) of the general formula (I):

$$(R)_\alpha\text{---}R'\text{---}(CS_2H)_\beta \qquad (I)$$

where:
R is a carbon-containing group, a fluorinated carbon-containing group or a fluorocarbon-containing group;
R' is a carbon-containing group, a multivalent atom, a double bond or hetero atom analog, a saturated, unsaturated, aromatic ring system or a hetero atom analog; and
α and β are integers the sum of which is less than a maximum number of substituents R' can accommodate to form a relatively stable molecular species, with all other sites being occupied by hydrogen atoms, to form a patterned substrate surface corresponding to a negative of the patterned stamp, where the pattern comprises SAM protected regions and unprotected regions.

The present invention provides a method for microcontacting printing including:

contacting a substrate including a base layer and a top layer with a stamp comprising a patterned surface coated with a dithiocarboxylic acid (DTCA) of the general formula (I):

$$(R)_\alpha\text{---}R'\text{---}(CS_2H)_\beta \qquad (I)$$

where:
R is a carbon-containing group, a fluorinated carbon-containing group or a fluorocarbon-containing group;
R' is a carbon-containing group, a multivalent atom, a double bond or hetero atom analog, a saturated, unsaturated, aromatic ring system or a hetero atom analog; and
α and β are integers the sum of which is less than a maximum number of substituents R' can accommodate to form a relatively stable molecular species, with all other sites being occupied by hydrogen atoms, to form a patterned top surface on the substrate, where the pattern corresponds to a negative of the pattern on the stamp and comprises SAM protected regions and unprotected regions.

The present invention provides a method for microcontacting printing including:

contacting a substrate including a base layer and a top layer with a stamp comprising a patterned surface coated with a dithiocarboxylic acid (DTCA) of the general formula (I):

$$(R)_\alpha\text{---}R'\text{---}(CS_2H)_\beta \qquad (I)$$

where:
R is a carbon-containing group, a fluorinated carbon-containing group or a fluorocarbon-containing group;
R' is a carbon-containing group, a multivalent atom, a double bond or hetero atom analog, a saturated, unsaturated, aromatic ring system or a hetero atom analog; and
α and β are integers the sum of which is less than a maximum number of substituents R' can accommodate to form a relatively stable molecular species, with all other sites being occupied by hydrogen atoms, to form a patterned top surface on the substrate, where the pattern corresponds to a negative of the pattern on the stamp and comprises SAM protected regions and unprotected regions; and removing the top layer from the unprotected regions to form substrate comprising a patterned top layer.

The present invention provides a method for micro-contacting printing including:

contacting a substrate including a base layer and a top layer with a stamp comprising a patterned surface coated with a dithiocarboxylic acid (DTCA) of the general formula (I):

(R)$_\alpha$—R'—(CS$_2$H)$_\beta$  (I)

where:

R is a carbon-containing group, a fluorinated carbon-containing group or a fluorocarbon-containing group;

R' is a carbon-containing group, a multivalent atom, a double bond or hetero atom analog, a saturated, unsaturated, aromatic ring system or a hetero atom analog; and α and β are integers the sum of which is less than a maximum number of substituents R' can accommodate to form a relatively stable molecular species, with all other sites being occupied by hydrogen atoms, to form a patterned top surface on the substrate, where the pattern corresponds to a negative of the pattern on the stamp and comprises SAM protected regions and unprotected regions;

removing the top layer from the unprotected regions to form substrate comprising a patterned top layer;

coating the patterned top layer of the substrate with a composition to form substrate including a patterned layer and a covering layer.

The present invention provides a method for micro-contacting printing including:

contacting a substrate including a base layer and a top layer with a stamp comprising a patterned surface coated with a dithiocarboxylic acid (DTCA) of the general formula (I):

(R)$_\alpha$—R'—(CS$_2$H)$_\beta$  (I)

where:

R is a carbon-containing group, a fluorinated carbon-containing group or a fluorocarbon-containing group;

R' is a carbon-containing group, a multivalent atom, a double bond or hetero atom analog, a saturated, unsaturated, aromatic ring system or a hetero atom analog; and α and β are integers the sum of which is less than a maximum number of substituents R' can accommodate to form a relatively stable molecular species, with all other sites being occupied by hydrogen atoms, to form a patterned top surface on the substrate, where the pattern corresponds to a negative of the pattern on the stamp and comprises SAM protected regions and unprotected regions;

removing the top layer from the unprotected regions to form substrate comprising a patterned top layer;

coating the patterned top layer of the substrate with a composition to form substrate including a patterned layer and a covering layer; and repeating the contacting, removing and coating steps to form substrate comprising multiple patterned layers each patterned layer separated by a covering layer.

The present invention provides a substrate including a surfacing having a pattern thereon, where the pattern includes exposed regions and self-assembled monolayer (SAM) protected regions, where the SAM comprises a dithiocarboxylic acid (DTCA) of the general formula (I):

(R)$_\alpha$—R'—(CS$_2$H)$_\beta$  (I)

where:

R is a carbon-containing group, a fluorinated carbon-containing group or a fluorocarbon-containing group;

R' is a carbon-containing group, a multivalent atom, a double bond or hetero atom analog, a saturated, unsaturated, aromatic ring system or a hetero atom analog; and α and β are integers the sum of which is less than a maximum number of substituents R' can accommodate to form a relatively stable molecular species, with all other sites being occupied by hydrogen atoms.

The preferred composition of formula (I) are composition wherein α and β are integers having a value of 1 or 2. The preferred composition are compositions wherein R is a linear.

DESCRIPTION OF THE DRAWINGS

The invention can be better understood with reference to the following detailed description together with the appended illustrative drawings in which like elements are numbered the same.

DETAILED DESCRIPTION OF THE INVENTION

The inventors have found that SAMs made from DTCAs are ideally suited for use in micro-contact printing to form patterned surfaces for use in microelectronic, nanotechnology such as nanoseparation techniques and micro channel analyzers and microchannel reactors. DTCAs form SAM layer on metal substrates such as gold, molybdenum, tungsten or the like. Unlike thiol alkanes, the DTCAs once patterned and the desired material formed on the unprotected regions of the surface can be removed from the surface under very mild conditions such as exposure to ambient conditions or mild oxidizing conditions. The DTCAs are light and thermally liable making them ideal candidates for microprocess printing or other techniques using SAMs to make patterned surfaces.

Micro-contact printing is a non-photolithographic method used to produce patterned SAMs on metal-coated substrates. An elastomeric poly(dimethylsiloxane) (PDMS) stamp with a patterned relief structure on its surface is "inked" with an organic solution, which typically consists of an normal alkanethiol dissolved in ethanol (2 mM). Bringing the stamp into contact with the metal surface facilitates the transfer of the relief pattern to the substrate. The resultant SAMs are sufficiently stable to serve as resists (i.e., etch masks) for wet chemical etching of the metal coating. When a SAM-patterned metal-coated substrate is dipped into an aqueous solution of chemical etchant (0.100 M potassium thiosulfate $K_2S_2O_3$, 0.001 M potassium ferricyanide $K_4Fe(CN)_6$), the thiosulfate ligand coordinates to the metal atoms that are not "protected" by the alkanethiol adsorbates, and the ferricyanide, ions subsequently oxidize the metal-ligand complex. This uncovers the underlying substrate, which is commonly comprised of either silicon or plastic, solely in areas that were previously coated with unprotected metal. Next, ultraviolet (UV) radiation is used to remove the remaining SAM coating and consequently expose a metal pattern on the substrate surface. This metal pattern can serve as a microscopic circuit or can be coated with semiconductor material to construct a miniature transistor.

The inventors have found that the ability to remove SAMs generated from aliphatic dithiocarboxylic acids (ADTCAs) from the surface of gold can be achieved with greater ease than using SAMs generated from aliphatic alkanethiols. Over the course of one week at room temperature and ambient relative humidity, exposure to air was found to oxidize and desorb ADTCA SAMs, which after rinsing revealed the underlying gold-coated substrate. Aliphatic alkanethiol SAMs subjected to the same conditions showed no indication of oxidation and retained structural integrity (i.e., no desorption occurred). Hence, stripping of ADTCA SAMs from the surface of gold can be accomplished without the use of UV radiation. The rate of ADTCA SAM removal, however, might be enhanced by exposure to UV radiation. Moreover, the removal of ADTCA SAMs will probably yield cleaner and more robust surfaces of gold than the removal of normal alkanethiol SAMs. Consequently, the use of ADTCAs instead of alkanethiols in the organic ink solution might allow for improvements in both fabrication methodology and performance in patterned device applications.

Since the main function of the alkanethiol SAMs in the metal pattern fabrication procedure described above is to serve as protective coatings against the chemical etchant, the inventors decided to evaluate the performance of ADTCA SAMs as wet etchant resists. The inventors prepared SAMs of either ADTCAs or alkanethiols on half of the surface of gold-coated wafers. The entire wafer was then immersed in the etching solution and removed when all of the gold on the unprotected half was visibly dissolved. The structural integrity of the SAMs on the protected halves of the wafers was evaluated both prior to and following immersion. Neither the ADTCA SAMs nor the alkanethiol SAMs showed any detectable deterioration from their pre-etched structures. Therefore, the ADTCA SAMs appear to be satisfactory resists against the wet chemical etchant for the immersion times used in the metal pattern fabrication process.

Alkanethiols self-assemble via the chemisorption of their mercapto head groups to the surface of gold. In a filly formed monolayer, these adsorbates are believed to exist as thiolate species bound to gold. Studies of the UV-induced desorption of alkanethiol SAMs in air showed that (1) radiation photosynthesizes ozone ($O_3$) from oxygen ($O_2$), and that (2) ozone subsequently oxidizes the thiolates to sulfonates. These sulfonates do not bind to the surface of gold and thus can be rinsed off with an appropriate solvent to expose bare gold. In contrast, ADTCAs bind to the surface of gold via a dithiocarboxylate head group. The difference in the chemical nature of the head group most likely gives rise to the difference in air oxidation reactivities observed for ADTCA SAMs versus alkanethiol SAMs. However, because of this difference, ADTCA adsorbates might generate oxidized products which are chemically different from sulfonates (i.e., sulfenyl sulfines, sulfinyl sulfines, and sulfonyl sulfines).

An immediate application for ADTCAs is as the organic ink in the micro-contact printing ($\mu CP$) process used in the fabrication of patterned metal devices such as those listed in the article concerning Lucent Technologies/Bell Labs. Moreover, SAMs of ADTCAs could serve as ideal temporary coatings in a range of applications which include the modification of adhesive, frictional, or wetting properties of surfaces.

General Methods for Contact Printing

The present invention relates to a method for micro-contacting printing including:

printing on a surface of a substrate a pattern including exposed regions and self-assembled monolayer (SAM) protected regions, where the SAM protected regions comprise a dithiocarboxylic acid (DTCA) of the general formula (I):

where:
R is a carbon-containing group, a fluorinated carbon-containing group or a fluorocarbon-containing group;
R' is a carbon-containing group, a multivalent atom, a double bond or hetero atom analog, a saturated, unsaturated, aromatic ring system or a hetero atom analog; and
α and β are integers the sum of which is less than a maximum number of substituents R' can accommodate to form a relatively stable molecular species, with all other sites being occupied by hydrogen atoms.

The present invention relates to a method for micro-contacting printing including:

printing on a surface of a substrate a pattern including exposed regions and self-assembled monolayer (SAM) protected regions, where the SAM protected regions comprise a dithiocarboxylic acid (DTCA) of the general formula (I):

where:
R is a carbon-containing group, a fluorinated carbon-containing group or a fluorocarbon-containing group;

R' is a carbon-containing group, a multivalent atom, a double bond or hetero atom analog, a saturated, unsaturated, aromatic ring system or a hetero atom analog; and α and β are integers the sum of which is less than a maximum number of substituents R' can accommodate to form a relatively stable molecular species, with all other sites being occupied by hydrogen atoms;

depositing a material on the exposed regions to form a patterned substrate; and removing the SAM protected regions under conditions sufficient to substantially completely remove the DTCA composed SAMs from the patterned substrate.

The present invention relates to a method for micro-contacting printing including:

printing on a surface of a substrate a pattern including exposed regions and self-assembled monolayer (SAM) protected regions, where the SAM protected regions comprise a dithiocarboxylic acid (DTCA) of the general formula (I):

$$(R)_\alpha\text{—}R'\text{—}(CS_2H)_\beta \qquad (I)$$

where:
R is a carbon-containing group, a fluorinated carbon-containing group or a fluorocarbon-containing group;

R' is a carbon-containing group, a multivalent atom, a double bond or hetero atom analog, a saturated, unsaturated, aromatic ring system or a hetero atom analog; and α and β are integers the sum of which is less than a maximum number of substituents R' can accommodate to form a relatively stable molecular species, with all other sites being occupied by hydrogen atoms;

depositing a material on the exposed regions to form a patterned substrate; and exposing the patterned substrate to a mild oxidative environment for a time sufficient of remove the DTCA SAMs from the patterned substrate.

When R' is a multivalent atom such as C, Si or Ge, then α+β is ≦n, where n is the number of substituents C, Si or Ge can accommodate to form a relatively stable DTCA. For C, Si or Ge, α+β will normally be ≦4. The maximum number of substituents preferably means that α+β will be less than or equal to the number of normal or traditional bonding sites including hypervalent bonding such as pentavalent carbon; provided, however, that the hypervalent DTCA is stable enough for making surface modified substrates and for micro-contacting printing.

When R' is a ring system, preferably an aryl group, including, without limitation, a phenyl group or a hetero atom containing phenyl group, a naphthyl group, a polycondensed aromatic group or heterocyclic analogs thereof (preferably phenyl); and α and β are integers having a sum no greater than the maximum number of substituents the R' group can accommodate. For phenyl, α+β cannot exceed 6. Preferably, α is between 1 and 3 and β is between 1 and 3.

When R' representing a double bond, suitable agents include, without limitations, double bonds having at least one R group and at least one $CS_2H$ group attached to two different positions of the double bond. Preferred agents have two R groups and two $CS_2H$ groups for C=C, C=Si and Si=Si double bonds or two $CS_2H$ group and one R for C=N and C=P double bonds. For R' representing ring systems, at least one R group is preferably in an opposed substitution arrangement with at least one $CS_2H$ group such as 1-R-4-($CS_2H$)-benzene, or 1,2-bis-(R)-4,5-bis($CS_2H$) benzene, or the like. Preferred ring systems are aryl rings (aromatic rings) with 5 and 6 membered aromatic rings or rings have π electrons being preferred.

By relatively stable molecular species, the inventors mean that the species does not decompose during storage and during microcontact printing and subsequent material deposition steps to an extent the self-assembled monolayers cannot be formed on a substrate surface. However, the DTCAs of this invention should still preferably be relatively liable upon exposure to ambient condition of oxygen, light and/or temperature which facilitates the removal of the SAMs after completion of the microcontact printing operation.

By mild conditions, the inventors means that the DTCAs can be removed upon exposure to ambient condition of oxygen, light and/or temperature. Of course, more aggressive conditions can also be used which will shorten the time needed for removal of the DTCA SAM regions.

General Patterned Substrates

A substrate including a surfacing having a pattern thereon, where the pattern includes exposed regions and self-assembled monolayer (SAM) protected regions, where the SAM protected regions comprise a dithiocarboxylic acid (DTCA) of the general formula (I):

$$(R)_\alpha\text{—}R'\text{—}(CS_2H)_\beta \qquad (I)$$

where:
R is a carbon-containing group, a fluorinated carbon-containing group or a fluorocarbon-containing group;

R' is a carbon-containing group, a multivalent atom, a double bond or hetero atom analog, a saturated, unsaturated, aromatic ring system or a hetero atom analog; and α and β are integers the sum of which is less than a maximum number of substituents R' can accommodate to form a relatively stable molecular species, with all other sites being occupied by hydrogen atoms.

Specific Methods for Contact Printing
Aliphatic Dithiocarboxylic Acid

The present invention relates to a method for micro-contacting printing including:

printing on a surface of a substrate a pattern including exposed regions and self-assembled monolayer (SAM) protected regions, where the SAM protected regions comprise an aliphatic dithiocarboxylic acid (ADTCA) of the general formula (II):

$$R\text{—}R'\text{—}CS_2H \qquad (II)$$

where:
R is a carbon-containing group, a fluorinated carbon-containing group or a fluorocarbon-containing group; and R' is a carbon-containing group.

The present invention relates to a method for micro-contacting printing including:

printing on a surface of a substrate a pattern including exposed regions and self-assembled monolayer (SAM) protected regions, where the SAM protected regions comprise a dithiocarboxylic acid (DTCA) of the specific formula (III):

$$(R)_\alpha\text{—}R'\text{—}(CS_2H)_\beta \qquad (III)$$

where:
R is a carbon-containing group, a fluorinated carbon-containing group or a fluorocarbon-containing group;
R' is a multivalent atom; and
α and β are integers the sum of which is less than a maximum number of substituents R' can accommodate to form a relatively stable molecular species, with all other sites being occupied by hydrogen atoms.

The present invention relates to a method for microcontacting printing including:
printing on a surface of a substrate a pattern including exposed regions and self-assembled monolayer (SAM) protected regions, where the SAM protected regions comprise a dithiocarboxylic acid (DTCA) of the specific formula (IV):

(IV)

where:
R is a carbon-containing group, a fluorinated carbon-containing group or a fluorocarbon-containing group;
R' is, a double bond or hetero atom analog, a saturated, unsaturated, aromatic ring system or a hetero atom analog; and
α and β are integers the sum of which is less than a maximum number of substituents R' can accommodate to form a relatively stable molecular species, with all other sites being occupied by hydrogen atoms.

The present invention relates to a method for microcontacting printing including:
printing on a surface of a substrate a pattern including exposed regions and self-assembled monolayer (SAM) protected regions, where the SAM protected regions comprise a dithiocarboxylic acid (DTCA) of the general formula (V):

(V)

where:
R is a carbon-containing group, a fluorinated carbon-containing group or a fluorocarbon-containing group;
R' is, a double bond or hetero atom analog, a saturated, unsaturated, aromatic ring system or a hetero atom analog; and
α and β are integers the sum of which is less than a maximum number of substituents R' can accommodate to form a relatively stable molecular species, with all other sites being occupied by hydrogen atoms.

The DTCAs of this invention are suitable for use in lithography and micro contact printing as described in U.S. Pat. Nos.: 6,180,288; 6,180,239; 6,165,911; 6,162,532; 6,159,742; 6,159,353; 6,143,412; 6,139,831; 6,127,129; 6,114,099; 6,097,862; 6,096,386; 6,096,175; 6,093,157; 6,087,655; 6,078,705; 6,074,725; 6,060,256; 6,060,121; 6,054,395; 6,048,623; 6,039,897; 6,034,775; 6,020,047; 6,004,444; 5,965,237; 5,959,297; 5,953,471; 5,951,881; 5,948,470; 5,938,904; 5,925,259; 5,922,550; 5,922,214; 5,905,007; 5,900,160; 5,852,229; 5,846,727; 5,788,853; 5,747,698; 5,516,003; 5,409,157; 5,324,569; 5,074,037; 4,358,795; and 4,120,263, incorporated herein by reference.

Figure 1:
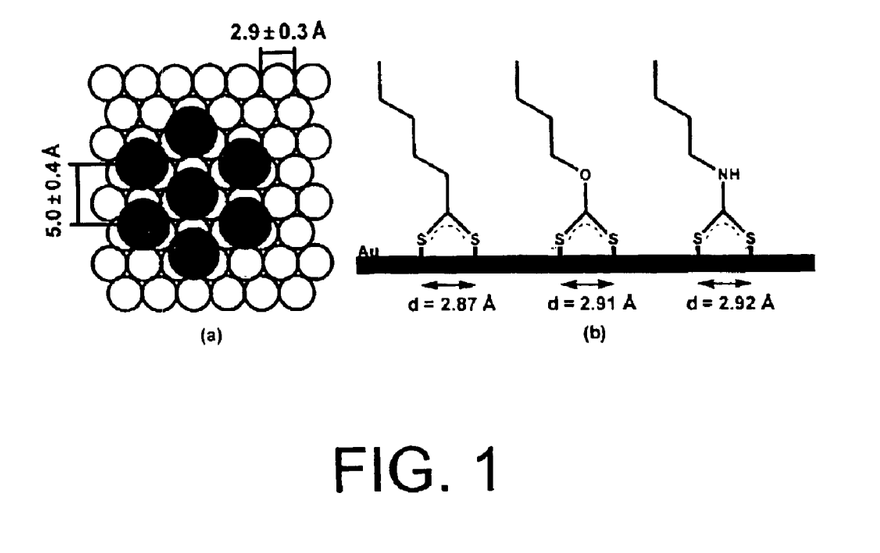
FIG. 1(a) depicts overlayer structure of n-alkanethiols on Au(111).
FIG. 1(b) depicts a proposed binding motif for aliphatic chelating moieties.

The inventor describe studies involving new types of SAMs generated from aliphatic dithiocarboxylic acids, $CH_3(CH_2)_nCS_2H$ (ADTCAs), where n=8–17. The inventors compared these films to those generated from their n-alkanethiol analogs, $CH_3(CH_2)_mS_H$, where m=9–18. The inventors chose to examine ADTCAs rather than the analogous dithiocarbamates or xanthates because the ADTCAs are structurally more similar to alkanethiols (FIG. 1b). Due to the potential binding of both sulfur atoms to gold,[23,25] we anticipated that ADTCA-based SAMs would exhibit unprecedented structural features. Molecular modeling studies showed, for example, that the distance between the centers of the two sulfur-atoms in ADTCAs is ca. 2.87 Å.[26] Given that the nearest-neighbor spacing measured for Au(111) is 2.9±0.3 Å,[27] these studies suggest a different attachment for the ADTCAs than is observed for alkanethiols, where the nearest-neighbor sulfur atoms reside ca. 5.0 Å apart (see FIG. 1).[14-17]

Suitable fluorocarbon ($R_f$) groups include, without limitation, any fluorocarbon-containing groups. These groups include, without limitation, fluorinated alkyl groups, fluorinated amyl groups, fluorinated ara alkyl groups, fluorinated alka amyl groups, fluorinated alkyl-alkylene oxide groups, fluorinated alkyl-alkylene amine groups, or other fluorinated groups including an alkyl moiety and a hetero atom containing moiety. Preferred, fluorinated alkyl, ara alkyl and alka amyl groups are described by the general formula $C_nF_iH_j$ where i+j is equal to one less than the maximum number of hydrogen atoms that would be needed to complete the bonding valence of the carbons atoms in the group and i>1, i.e., the group has at least one F atom associated therewith. The alkyl moiety can be linear or branched. If the fluorinated group is a fluorinated linear alkyl group, then i+j=2n−1 and i>1. Preferred fluorinated moieties include linear fluorinated alkyl moieties of the general formula $F(CF_2)_k(CH_2)_l$ where k is an integer having a value between 1 and 30 and l is an integer having a value between 0 and about 2. Preferably, k is an integer having a value between 5 about and about 20 and particularly between about 8 and about 18. When $R_f$ includes atoms other than carbon, hydrogen and fluorine, the other atoms generally should not be substantially susceptible to radical addition or abstraction reactions and are stable to chemical reduction under the conditions described in the preparation of the surface modifying agents of formulas (I)–(V) as described herein.

It should be recognized that although preferred ranges for the fluorinated carbon-containing groups are given, the particular choice of k and l for the group will depend on the purpose to which the surface to be treated is to be put. In some applications, a short perfluorinated-head group could be used, while in other applications longer perfluorinated-head groups may be preferred.

Suitable R groups include, without limitation, linear or branched moieties of the general formula $(CH_2)_p$ where pp is an integer having a value between about 1 and about 50, a branched alkenyl group, an alkenyl amyl group, an ara alkenyl group, an alkyleneoxide group, an alkylalkyleneoxide group, alkyl amino acid group, or mixture or combinations thereof. Preferred R groups include $(CH_2)_{pp}$ groups where pp is an integer having a value between about 1 and about 40. The R group can also include atoms other than carbon and hydrogen. Preferred groups including oxygen are groups including one or more methylene oxide or ethylene oxide moieties in the carbon chain. Alkylated amine groups in the carbon chain are also useful R groups. Such R groups including non-carbon atoms should also be substantially non-susceptible to radical addition or abstraction reactions. R is preferably a linear group to enhance the packing of the surface modifying agent on the treated surface.

EXPERIMENTAL SECTION

Materials

Gold shot (99.99%) was purchased from Americana Precious Metals. Chromium rods (99.9%) were purchased from R. D. Mathis Company. Single-crystal silicon(100) wafers, which were polished on one side, were obtained from Silicon Sense, Inc. and rinsed with absolute ethanol (McCormick Distilling Co., Inc.) before use. The liquids used for contact angle measurements were of the highest purity available from Aldrich Chemical Co. and were used without purification. Alkanethiols used to generate the SAMs were either commercially available or synthesized using established methods. The ADTCAs were synthesized via Grignard addition of alkylmagnesium bromides to carbon disulfide (CS2);28,29 experimental details are included as Supplementary Material. The fragile nature of some species of dithiocarboxylic acids has been reported.30,31 In analyses by 1H nuclear magnetic resonance (NMR) spectroscopy, we found that initially pure samples of the ADTCAs stored at 0° C. would undergo partial decomposition (e.g., <5%) to unidentified impurities in a matter of weeks. These impurities, however, could be readily removed using the procedures detailed in the Supplementary Material. Furthermore, ADTCAs purified in this manner were able to withstand offsite shipping for elemental analysis (roughly one week at rt) without detectable degradation. The purity of all ADTCAs used for making SAMs was >98% as judged by 1H and 13C NMR spectroscopy.

Preparation of SAMs

Solutions of the dithiocarboxylic acids and thiols were prepared in weighing bottles that were cleaned by soaking in piranha solution (7:3 H2SO4/H2O2) for 1 h; Caution: piranha solution reacts violently with organic materials and should be handled carefully. The bottles were then rinsed with deionized water and absolute ethanol. The gold substrates were prepared by thermally evaporating ca. 100 Å of chromium onto the polished surfaces of the silicon wafers, followed by evaporating ca. 2000 Å of gold. Deposition pressures were maintained at ca. 1×10−7 torr. Chromium serves to promote the adhesion of gold to silicon.32 The freshly prepared gold-coated wafers were immediately transferred to Fluoroware containers, where they were stored until used. The wafers were cut into slides (ca. 1 cm×3 cm) with a diamond-tipped stylus. The slides were washed with absolute ethanol and blown dry with ultra-pure nitrogen. Ellipsometric data for the bare gold were collected. The slides were then washed with ethanol and immersed in solutions of the respective dithiocarboxylic acids (1 mM in ethanol) or thiols (1 mM in ethanol). All ADTCA solutions were prepared immediately following purification of the acids (typically less than one day); only freshly prepared solutions were employed in the formation of SAMs. All substrates were allowed to equilibrate simultaneously for a period of 24 h. The resultant SAMs were thoroughly rinsed with ethanol and blown dry with ultra-pure nitrogen before immediate characterization.

Ellipsometric Thicknesses

The thicknesses of the monolayers were measured with a Rudolph Research Auto EL III ellipsometer equipped with a He—Ne laser (632.8 nm) at an incident angle of 70∞. A refractive index of 1.45 was assumed for all films. For a given sample, the data were averaged over three separate slides using three spots per slide.

Contact Angle Wettabilities

Advancing and receding contact angles were measured with a ramé-hart model 100 contact angle goniometer. The contacting liquids, hexadecane (C16H34; HD) and water (H2O; W), were dispensed and withdrawn with a Matrix Technologies micro-Electrapipette 25 operated at the slowest possible speed (ca. 1 $\mu$L/s). For a given sample, the data were averaged over three separate slides using three drops per slide, and measuring angles from opposite edges of each drop. The measurements were performed at 293 K with the pipette tip in contact with the drop.

Infrared Spectroscopy

Polarization Modulation Infrared Reflection Absorption Spectroscopy (PM-IRRAS) data were collected using a Nicolet MAGNA-IR 860 Fourier transform spectrometer equipped with a liquid nitrogen-cooled mercury-cadmium-telluride (MCT) detector and a Hinds Instruments PEM-90 photoelastic modulator. The p-polarized light was incident at 80°. The spectra were collected for 1000 scans at a spectral resolution of 4 cm−1.

Details of the Synthesis and Purification of Aliphatic Dithiocarboxylic Acids

Scheme 1. General Strategy for the Synthesis and Purification of Aliphatic Dithiocarboxylic Acids.

Notes and Observations

For the purpose of illustration, the synthesis of n-dithiodecanoic acid is detailed below. Other dithiocarboxylic acids were synthesized in an analogous fashion. We have observed that all of the aliphatic dithiocarboxylic acids are, in our hands, somewhat fragile. In analyses by $^1$H NMR, for example, we observe decomposition to unidentified impurities in a matter of weeks, even when stored under argon at −20° C. The exhaustive extractions and washings detailed below, however, can be used to produce analytically pure samples.

Overall yield ~48%

Materials and Methods

Tetrahydrofuran (EM Sciences) was dried by passing through alumina and degassed by freeze-pump-thaw methods. Carbon disulfide (EM Sciences) was distilled from phosphorus pentoxide (J. T. Baker Chemical Co.) and degassed by freeze-pump-thaw methods. The normal alkyl bromides used to synthesize the dithiocarboxylic acids were either commercially available (Aldrich Chemical Co.) or synthesized using established methods. Magnesium (EM Science), pyridine (Fisher Scientific), 1,2-dibromoethane (Aldrich Chemical Co.), and triethanolamine (J. T. Baker Chemical Co.) were used as received. Hexanes, diethyl ether, 2,2,4-trimethylpentane (isooctane), magnesium sulfate, and conc. aq. HCl (EM Science) were also used as received. Nuclear magnetic resonance (NMR) spectra were collected on a General Electric QE-300 spectrometer using a resonance frequency of 300 MHz for $^1$H and 75 MHz for $^{13}$C.

n-Dithiodecanoic Acid.

A 500 mL two-necked round-bottomed flask was equipped with a magnetic stirring bar and filled with 5.87 g (0.241 mol) of freshly ground magnesium turnings. The flask was fitted with a dropping funnel and a reflux condenser. The entire apparatus was flame-dried under a flow of argon. In a separate flame-dried and argon-purged flask, a solution of 10 g (0.048 mol) of 1-bromononane in ca. 250 mL of dry and degassed tetrahydrofuran was prepared. The solution was transferred via cannula to the dropping funnel. The magnesium turnings were covered with ca. 5 mL of dry and degassed tetrahydrofuran. Two drops of 1,2-dibromoethane were added to the stirred Mg/THF mixture to initiate the reaction. At the first signs of ethylene evolution, the alkylbromide solution was added. The rate of addition was adjusted to maintain a gentle reflux of the mixture. After the addition of the alkylbromide was completed, the mixture was heated to reflux at 80 ∞C for 0.5 h.

In a separate flame-dried and argon-purged flask, 11.03 g (0.1448 mol) of carbon disulfide was placed and cooled to 0 ∞C in an ice bath. The solution of the Grignard reagent in tetrahydrofuran was allowed to cool to rt before addition via cannula to the carbon disulfide. During addition, the cooled flask was shaken vigorously. Upon addition, the solution became reddish-orange in appearance. After the addition, the solution was allowed to warm to rt. Equal volumes of diethyl ether and deionized water were added to the solution, and conc. HCl was added dropwise with stirring until the aqueous layer was acidic to litmus. The organic layer was separated, and the aqueous layer was extracted with diethyl ether (3×50 mL). The organic extracts were combined and washed with deionized water (3×100 mL) and sat. NaCl soln. (1×100 mL). The solution was dried over MgSO$_4$, filtered, and concentrated by rotary evaporation.

The crude reddish-orange oil was dissolved in 100 mL of isooctane and cooled to −10 ∞C in a salt/ice bath. To this solution was added 7.64 g (0.0965 mol) of pyridine. After stirring in the ice bath for 10 min, the pyridine salt precipitated as a yellow-orange solid. The solvents were removed from the precipitate by filtration through a cannula. The precipitate was washed with cold isooctane (3×100 mL), allowed to warm to rt, and redissolved in 100 mL of isooctane. The solution was extracted with triethanolamine (1×20 mL). The triethanolamine solution was washed with hexanes (3×25 mL) and mixed with a final aliquot of hexanes (100 mL). Deionized water (100 mL) was added to the mixture, and conc. HCl was added dropwise with stirring until the aqueous layer was acidic to litmus. The aqueous layer was separated, and the organic layer was washed with deionized water (3×100 mL) and sat. NaCl soln. (1×100 mL). The solution was dried over MgSO$_4$, filtered, and concentrated by rotary evaporation to yield 4.76 g (0.0233 mol, 48% yield) of CH$_3$(CH$_2$)$_8$CS$_2$H as an orange liquid. $^1$H NMR (300 MHz, CDCl3): δ 0.88 (t, J=7 Hz, 3 H), 1.17–1.50 (m, 12 H), 1.81 (quintet, J=7 Hz, 2 H), 2.98 (t, J=8 Hz, 2 H). $^{13}$C NMR (75 MHz, CDCl$_3$): δ 14.3, 22.9, 28.8, 29.5 (two peaks), 29.6, 30.9, 32.1, 53.8, 239.1. Anal. Calcd for C$_{10}$H$_{20}$S$_2$: C, 58.77; H, 9.86. Found: C, 58.88; H, 9.87.

n-Dithioundecanoic acid.

This compound was obtained as an orange liquid. $^1$H NMR (300 MHz, CDCl$_3$): δ 0.88 (t, J=7 Hz, 3 H), 1.10–1.45 (m, 14 H), 1.82 (quintet, J=7 Hz, 2 H), 2.98 (t, J=8 Hz, 2 H). $^{13}$C NMR (75 MHz, CDCl$_3$): δ 14.3, 22.9, 28.8, 29.5, 29.6, 29.7, 30.0, 30.9, 32.1, 53.8, 239.1. Anal. Calcd for C$_{11}$H$_{22}$S$_2$: C, 60.49; H, 10.15. Found: C, 60.82; H, 10.18.

n-Dithiododecanoic acid.

This compound was obtained as an orange liquid. $^1$H NMR (300 MHz, CDCl$_3$): δ 0.88 (t, J=7 Hz, 3 H), 1.12–1.45 (m, 16 H), 1.81 (quintet, J=7 Hz, 2 H), 2.98 (t, J=8 Hz, 2 H). $^{13}$C NMR (75 MHz, CDCl$_3$): δ 14.3, 22.9, 28.8, 29.47, 29.54, 29.6, 29.8 (two peaks), 30.9, 32.1, 53.8, 239.1. Anal. Calcd for C$_{12}$H$_{24}$S$_2$: C, 62.01; H, 10.41. Found: C, 61.77; H, 10.02.

n-Dithiotridecanoic acid.

This compound was obtained as an orange liquid. $^1$H NMR (300 MHz, CDCl$_3$): δ 0.88 (t, J=7 Hz, 3 H), 1.15–1.44 (m, 18 H), 1.82 (quintet, J=7 Hz, 2 H), 2.98 (t, J=8 Hz, 2 H). $^{13}$C NMR (75 MHz, CDCl$_3$): δ 14.3, 22.9, 28.8, 29.4, 29.55, 29.61, 29.8 (two peaks), 30.1, 30.9, 32.1, 53.8, 239.1. Anal. Calcd for C$_{13}$H$_{26}$S$_2$: C, 63.35; H, 10.63. Found: C, 63.20; H, 10.30.

n-Dithiotetradecanoic acid.

This compound was obtained as an orange liquid. $^1$H NMR (300 MHz, CDCl$_3$): δ 0.88 (t, J=7 Hz, 3 H), 1.17–1.48 (m, 20 H), 1.82 (quintet, J=7 Hz, 2 H), 2.98 (t, J=8 Hz, 2 H). $^{13}$C NMR (75 MHz, CDCl$_3$): δ 14.4, 22.9, 28.8, 29.5, 29.6, 29.7, 29.9 (multiple peaks), 30.3, 30.9, 32.2, 53.9, 239.2. Anal. Calcd for C$_{14}$H$_{28}$S$_2$: C, 64.55; H, 10.83. Found: C, 64.48; H, 10.73.

n-Dithiopentadecanoic acid.

This compound was obtained as an orange liquid. $^1$H NMR (300 MHz, CDCl$_3$): δ 0.88 (t, J=7 Hz, 3 H), 1.18–1.43 (m, 22 H), 1.82 (quintet, J=7 Hz, 2 H), 2.98 (t, J=8 Hz, 2 H). $^{13}$C NMR (75 MHz, CDCl$_3$): δ 14.4, 22.9, 28.8, 29.5, 29.7, 29.9 (multiple peaks), 30.9, 32.2, 53.9, 239.2. A satisfactory analysis could not be obtained. Anal. Calcd for C$_{15}$H$_{30}$S$_2$: C, 65.63; H, 11.02. Found: C, 64.88; H, 10.97.

n-Dithiohexadecanoic acid.

This compound was obtained as an orange liquid. $^1$H NMR (300 MHz, CDCl$_3$): δ 0.89 (t, J=7 Hz, 3 H), 1.18–1.43 (m, 24 H), 1.82 (quintet, J=7 Hz, 2 H), 2.98 (t, J=8 Hz, 2 H). $^{13}$C NMR (75 MHz, CDCl$_3$): δ 14.4, 22.9, 28.8, 29.5, 29.6, 29.9 (multiple peaks), 30.3, 30.9, 32.1, 53.8, 239.1. Anal. Calcd for C$_{16}$H$_{32}$S$_2$: C, 66.60; H, 11.18. Found: C, 66.36; H, 11.02.

n-Dithioheptadecanoic acid.

This compound was obtained as an orange liquid. $^1$H NMR (300 MHz, CDCl$_3$): δ 0.88 (t, J=7 Hz, 3 H), 1.15–1.40 (m, 26 H), 1.81 (quintet, J=7 Hz, 2 H), 2.98 (t, J=8 Hz, 2 H). $^{13}$C NMR (75 MHz, CDCl$_3$): δ 14.4, 22.9, 28.8, 29.5, 29.6, 29.9 (multiple peaks), 30.9, 32.2, 53.9, 239.2. Anal. Calcd for C$_{17}$H$_{34}$S$_2$: C, 67.48; H, 11.33. Found: C, 67.18; H, 11.45.

n-Dithiooctadecanoic acid.

This compound was obtained as an orange solid. $^1$H NMR (300 MHz, CDCl$_3$): δ 0.88 (t, J=7 Hz, 3 H), 1.19–1.42 (m, 28 H), 1.82 (quintet, J=7 Hz, 2 H), 2.98 (t, J=8 Hz, 2 H).

$^{13}$C NMR (75 MHz, CDCl$_3$): δ 14.4, 22.9, 28.8, 29.4, 29.6, 29.9 (multiple peaks), 30.2, 30.9, 32.2, 53.8, 239.1. Anal. Calcd for C$_{18}$H$_{36}$S$_2$: C, 68.29; H, 11.46. Found: C, 68.02; H, 11.47.

n-Dithiononadecanoic acid.

This compound was obtained as an orange solid. $^1$H NMR (300 MHz, CDCl$_3$): δ 0.88 (t, J=7 Hz, 3 H), 1.20–1.42 (m, 30 H), 1.82 (quintet, J=7 Hz, 2 H), 2.98 (t, J=8 Hz, 2 H). $^{13}$C NMR (75 MHz, CDCl$_3$): δ 14.4, 22.9, 28.8, 29.5, 29.6, 29.7, 29.9 (multiple peaks), 30.1, 30.9, 32.1, 53.8, 239.2. Anal. Calcd for C$_{19}$H$_{38}$S$_2$: C, 69.02; H, 11.58. Found: C, 69.17; H, 11.80.

RESULTS AND DISCUSSION

Thicknesses of the Films

Figure 2:
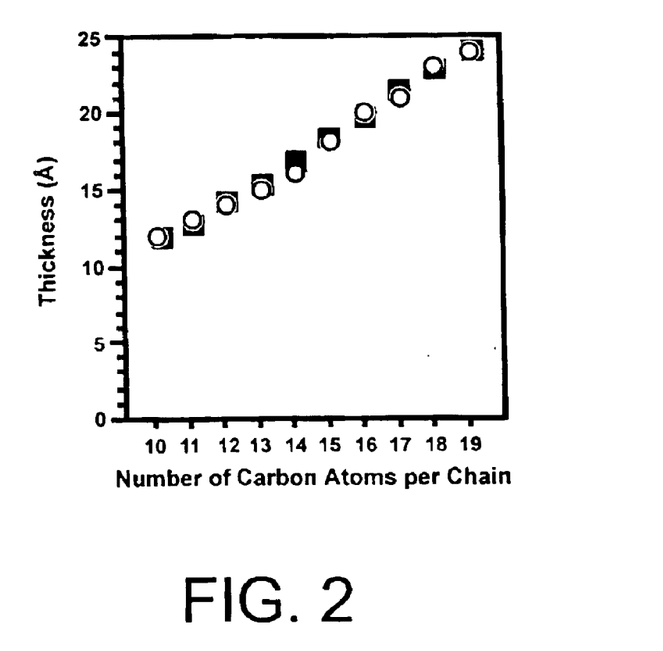
FIG. 2 depicts an ellipsometric thicknesses of SAMs generated from dithiocarboxylic acids (filled squares) and alkanethiols (empty circles)

Measurements of the ellipsometric thicknesses of SAMs can provide a rough estimate of film quality.14 The inventors compared the thicknesses of SAMs generated from the ADTCAs to the thicknesses of SAMs generated from their alkanethiol counterparts having the same number of carbon atoms. FIG. 2 shows that the thicknesses of the two types of films are indistinguishable (±1 Å). These results are consistent with a model in which the ADTCAs bind to the surface of gold in a fashion such that the alkyl chains are densely packed and oriented away from the surface.

Wettabilities of the Films

Figure 3:
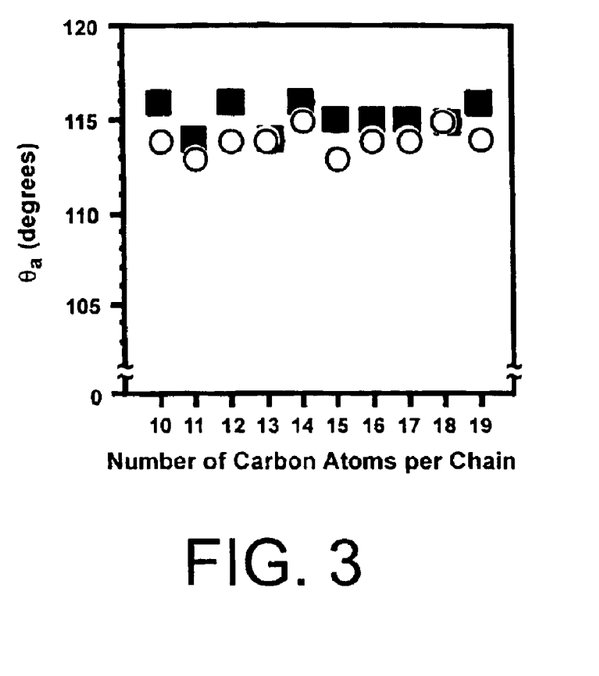
FIG. 3 depicts an advancing contact angles of water on SAMs generated from dithiocarboxylic acids (filled squares) and alkanethiols (empty circles)

Contact angle measurements respond to changes in the quality and structure of organic thin films.14 We compared the wettabilities of SAMs generated from ADTCAs to the wettabilities of SAMs generated from the corresponding alkanethiols (FIG. 3). The average advancing contact angle of water (θaH2O) for the ADTCA SAMs was 115±2°; that for the alkanethiol SAMs was 114±2°, and thus indistinguishable. These data suggest that the interfaces formed by both types of SAMs are similarly hydrophobic.

Figure 4:
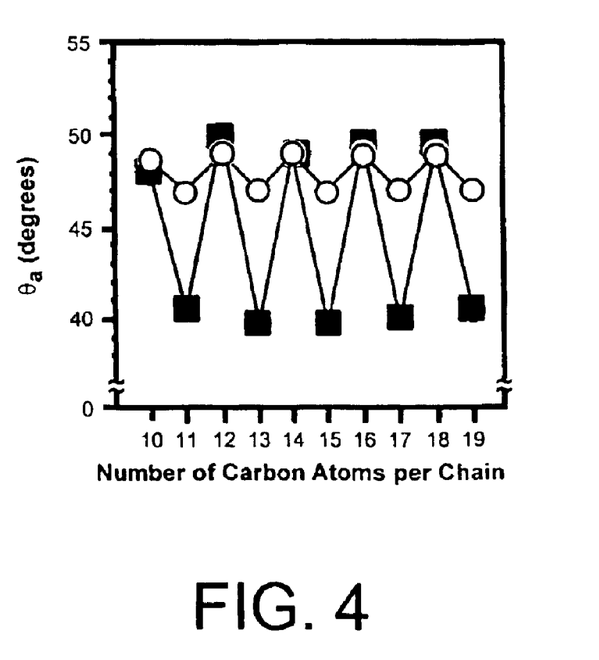
FIG. 4 depicts an advancing contact angles of hexadecane on SAMs generated from dithiocarboxylic acids (filled squares) and alkanethiols (empty circles)
Figure 5:
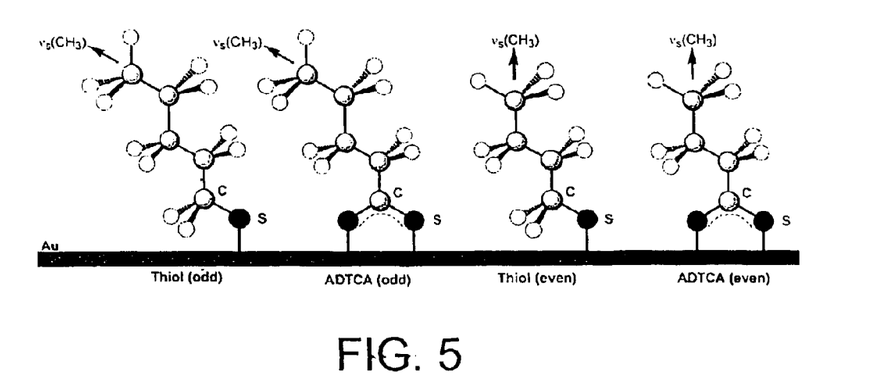
FIG. 5 illustrates the terminal methyl group orientation for adsorbates possessing odd and even numbers of carbon atoms.

The contact angles of dispersive liquids such as hexadecane (HD) are remarkably sensitive to the orientation and composition of low energy surfaces generated by the adsorption of organic molecules.[14,33,34] We compared the advancing contact angles of hexadecane (θaHD) observed on the ADTCA SAMs with those observed on the corresponding alkanethiol SAMs (FIG. 4). Both types of SAMs exhibit a similar zig-zag pattern where the value of the contact angles are higher on films composed of even-numbered carbon chain lengths and lower on films composed of odd-numbered carbon chain lengths. This type of "odd-even" effect has been observed in other studies of alkanethiol-based SAMs and is generally interpreted to reflect the increased wettability of methylene vs. methyl groups exposed at the interface (FIG. 5).[33,34] The magnitude of the "odd-even" effect is, however, dramatically greater for ADTCA SAMs, where Δθ (qaeven-qaodd) is approximately 9°; Δθ for the alkanethiol SAMs is approximately 2°. This difference in magnitude suggests that the structural features of the ADTCA SAMs differ from those of the alkanethiol SAMs.

Characterization by PM-IRRAS

Figure 6:
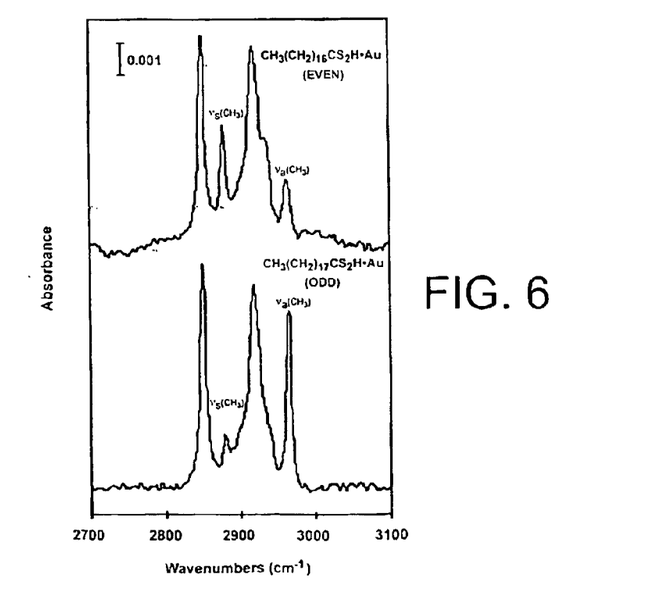
FIG. 6 depicts a PM-IRRAS spectra of the C—H stretching region for SAMs derived from C$_{18}$S$_2$H (upper) and C$_{19}$S$_2$H (lower)

To confirm that the differences in wettability for the odd- and even-numbered ADTCA SAMs are due to orientational differences at the interfaces of these films, we examined two representative ADTCA SAMs by surface IR spectroscopy (PM-IRRAS). If the known "odd-even" effect is responsible for the observed differences in wettabilities, the relative intensities of the methyl symmetric C—H stretch, υs (CH$_3$), at 2878 cm-1 and the methyl asymmetric C—H stretch, υa (CH3), at 2964 cm-1 should change as the orientation of the terminal methyl group changes (see FIG. 5).33,35 FIG. 6 shows the PM-IRRAS spectra of SAMs generated from CH$_3$(CH$_2$)$_{16}$CS$_2$H(C$_{18}$S$_2$H) and CH$_3$(CH$_2$)$_{17}$CS$_2$H (C$_{19}$S$_2$H). The spectrum of C18S2H exhibits a υs (CH$_3$) stretch of higher intensity than the υa (CH$_3$) stretch. This ratio is consistent with a structure in which the terminal methyl group is oriented perpendicular (i.e., normal) to the surface. The spectrum of C$_{19}$S$_2$H exhibits a substantial increase in the intensity of the υa (CH$_3$) stretch at the expense of the intensity of the υs (CH$_3$) stretch. This result is consistent with a tilting of the terminal methyl group away from the surface normal, which would expose the more wettable methylene moieties. Indeed, we observe increased wettabilities (lower contact angles) on the surfaces of the ADTCA SAMs having odd-numbered carbon chain lengths.

The enhanced "odd-even" effect observed for the ADTCA SAMs suggests that the alkyl chains are oriented differently than those of normal alkanethiolate SAMs. It seems plausible that chelation of type shown in FIG. 5 could impose structural constraints (e.g., torsional stiffening) that would lead to the observed enhancement (vide supra). The potential for chelation in these new SAMs is particularly intriguing due to the known stability afforded by the entropy-driven "chelate effect".[36-40] The ability to generate highly robust SAMs on gold will undoubtedly extend their use in the types of technologies noted in the Introduction. Furthermore, since the key step in our synthetic route to aliphatic dithiocarboxylic acids relies on simple Grignard addition to CS$_2$, the synthesis of ω-functionalized dithiocarboxyic acids (and thus new types of functionalized interfaces) appears tenable as long as compatible (or appropriately protected) ω-functional groups are employed during this step.

Of particular importance is the fact that SAMs comprising the dithiocarboxylic acids of this invention are liable to light and/or oxidation. Thus, upon standing in air under ambient light and ambient temperature, the SAMs comprising the dithiocarboxylic acids disappear from the surface leaving a substantially to completely clean surface without the need of more aggressive cleaning conditions generally needed when using alkane thiols.

SAMs of ADTCAs and alkanethiols were prepared on gold-coated (200 Å) silicon substrates. The air oxidation of the SAMs was monitored using X-ray photoelectron spectroscopy (XPS), polarization modulation infrared reflectance absorption spectroscopy (PM-IRRAS), and contact angle goniometry. The oxidation state of sulfur was determined by measuring the binding energy of the S2p photoelectron peak. PM-IRRAS was used to observe the vibrational frequencies of sulfur-oxygen stretches in oxidized adsorbates. The structural integrity of the films prior to and following chemical etching was evaluated by PM-IRRAS and contact angle goniometry. The crystalline order of the monolayers was measured by the vibrational frequency of the asymmetric methylene stretch of the hydrocarbon backbone of the adsorbates. Contact angle goniometry was used to probe the order of the crystalline hydrocarbon surface of the monolayers by evaluating the wettability of hexadecane on the SAMs.

CONCLUSIONS

A series of aliphatic dithiocarboxylic acids were synthesized and used to generate SAMs on gold. Ellipsometric measurements confirmed that the ADTCAs adsorb onto gold as highly oriented monolayer films. Measurements of the advancing contact angle of water showed that the ADTCAs form hydrophobic interfaces consistent with methyl termination. Measurements of the advancing contact angle of hexadecane showed remarkably large "odd-even" effects for the ADTCA SAMs, which is also consistent with methyl termination. Characterization by PM-IRRAS provided structural support for the "odd-even" effect. Further analyses by PM-IRRAS,41,42 atomic force microscopy (AFM),27 X-ray photoelectron spectroscopy (XPS),23 and diffraction studies18,20 should provide more insight into the structural features (e.g., adsorption sites, chain tilt, and interchain packing) of this new class of SAM.

Removal of SAMs From Gold Surface

Microcontact printing is a non-photolithographic method used to produce patterned SAMs on metal-coated substrates. An elastomeric poly(dimethylsiloxane) (PDMS) stamp with a patterned relief structure on its surface is "inked" with an organic solution, which typically consists of an normal alkanethiol dissolved in ethanol (2 mM). Bringing the stamp into contact with the metal surface facilitates the transfer of the relief pattern to the substrate. The resultant SAMs are sufficiently stable to serve as resists (i.e., etch masks) for wet chemical etching of the metal coating. When a SAM-patterned metal-coated substrate is dipped into an aqueous solution of chemical etchant (0.100 M potassium thiosulfate $K_2S_2O_3$, 0.001 M potassium ferricyanide $K_4Fe(CN)_6$), the thiosulfate ligand coordinates to the metal atoms that are not "protected" by the alkanethiol adsorbates, and the ferricyanide ions subsequently oxidize the metal-ligand complex. This uncovers the underlying substrate, which is commonly comprised of either silicon or plastic, solely in areas that were previously coated with unprotected metal. Next, ultraviolet (UV) radiation is used to remove the remaining SAM coating and consequently expose a metal pattern on the substrate surface. This metal pattern can serve as a microscopic circuit or can be coated with semiconductor material to construct a miniature transistor.

The method of this invention involves the ability to remove SAMs generated from aliphatic dithiocarboxylic acids from the surface of gold with greater ease than SAMs generated from aliphatic alkanethiols. Over the course of one week at room temperature and ambient relative humidity, exposure to air was found to oxidize and desorb ADTCA SAMs, which after rinsing revealed the underlying gold-coated substrate. Aliphatic alkanethiol SAMs subjected to the same conditions showed no indication of oxidation and retained structural integrity (i.e., no desorption occurred). Hence, stripping of ADTCA SAMs from the surface of gold can be accomplished without the use of UV radiation. The rate of ADTCA SAM removal, however, might be enhanced by exposure to UV radiation. Moreover, the removal of ADTCA SAMs yield cleaner and more robust surfaces of gold than the removal of normal alkanethiol SAMs. Consequently, the use of ADTCAs instead of alkanethiols in the organic ink solution allow for improvements in both fabrication methodology and performance in patterned device applications.

Since the main function of the alkanethiol SAMs in the metal pattern fabrication procedure described above is to serve as protective coatings against the chemical etchant, the wet etchant resistance of ADTCA SAMs were evaluated. SAMs were prepared of either ADTCAs or alkanethiols on half of a surface of a gold-coated wafers. The entire wafer was then immersed in an etching solution and removed when all of the gold on the unprotected half was visibly dissolved. The structural integrity of the SAMs on the protected halves of the wafers was evaluated both prior to and following immersion. Neither the ADTCA SAMs nor the alkanethiol SAMs showed any detectable deterioration from their pre-etched structures. Therefore, the ADTCA SAMs appear to be satisfactory resists against the wet chemical etchant for the immersion times used in the metal pattern fabrication process.

Alkanethiols self-assemble via the chemisorption of their mercapto head groups to the surface of gold. In a fully formed monolayer, these adsorbates are believed to exist as thiolate species bound to gold. Studies of the UV-induced desorption of alkanethiol SAMs in air showed that (1) radiation photosynthesizes ozone ($O_3$) from oxygen ($O_2$), and that (2) ozone subsequently oxidizes the thiolates to sulfonates. These sulfonates do not bind to the surface of gold and thus can be rinsed off with an appropriate solvent to expose bare gold. In contrast, ADTCAs bind to the surface of gold via a dithiocarboxylate head group. The difference in the chemical nature of the head group most likely gives rise to the difference in air oxidation reactivities observed for ADTCA SAMs versus alkanethiol SAMs. However, because of this difference, ADTCA adsorbates likely generate oxidized products which are chemically different from sulfonates (i.e., sulfenyl sulfines, sulfinyl sulfines, and sulfonyl sulfines). Although these oxidized species should also not plausibly bind to the surface of gold, a better understanding of the exact nature of the oxidation products is needed to provide a more precise comparison to the alkanethiol system. Studies concerning this issue currently in progress within our laboratories. In addition to this issue, we are also interested in exploring the differences between the rates of oxidation for ADTCA and alkanethiol SAMs by air, UV radiation and $O_2$ (to yield photogenerated ozone), and $O_3$ (produced via electrical discharge). Such studies will reveal whether ADTCA SAMs also desorb faster than alkanethiol SAMs in the presence of ozone.

An immediate application for ADTCAs is as the organic ink in the $\mu$CP process used in the fabrication of patterned metal devices such as those listed in the article concerning Lucent Technologies/Bell Labs. Moreover, SAMs of ADTCAs are ideal suited for temporary coatings in a range of applications which include the modification of adhesive, frictional, or wetting properties of surfaces.

SAMs of ADTCAs and alkanethiols were prepared on gold-coated (200 Å) silicon substrates. The air oxidation of the SAMs was monitored using X-ray photoelectron spectroscopy (XPS), polarization modulation infrared reflectance absorption spectroscopy (PM-IRRAS), and contact angle goniometry. The oxidation state of sulfur was determined by measuring the binding energy of the S2p photoelectron peak. PM-IRRAS was used to observe the vibrational frequencies of sulfur-oxygen stretches in oxidized adsorbates. The structural integrity of the films prior to and following chemical etching was evaluated by PM-IRRAS and contact angle goniometry. The crystalline order of the monolayers was measured by the vibrational frequency of the asymmetric methylene stretch of the hydrocarbon backbone of the adsorbates. Contact angle goniometry was used to probe the order of the crystalline hydrocarbon surface of the monolayers by evaluating the wettability of hexadecane on the SAMs. Further studies of these new SAMs are currently underway.

Micro-Contact Printing

Figure 7:
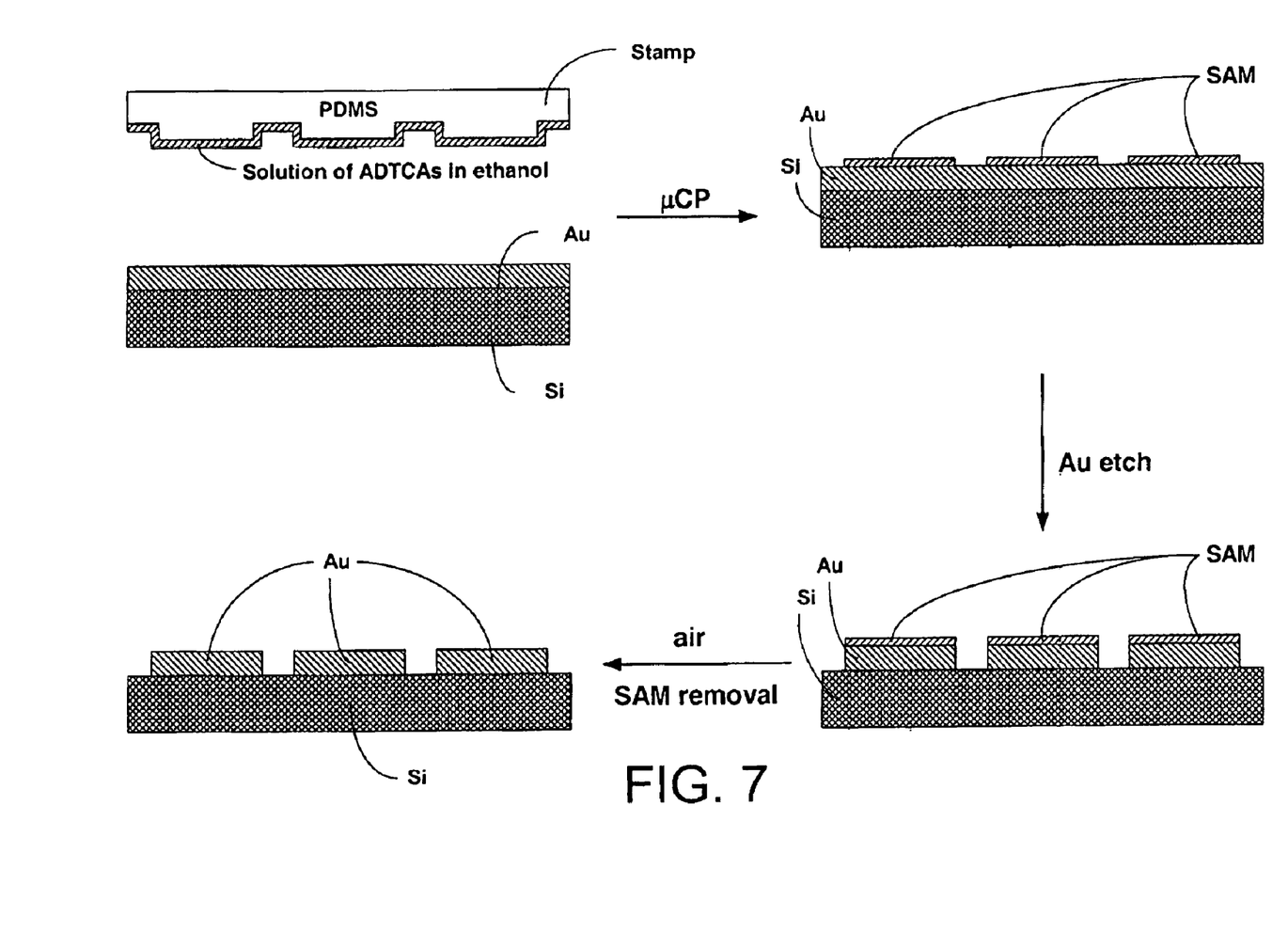
FIG. 7 schematically depicts a micro-contact printing process.

Miniaturization is one of the most significant issues concerning the microelectronics industry. Xia, Y.; Whitesides, G. M. *Angew. Chem. Int. Ed.* 1998, 37, 550. The ability to reliably produce circuits with sub-micron features will ultimately facilitate the development of nanoscale devices, such as micro-electromechanical systems (MEMS). Xia, Y.; Whitesides, G. M. *Angew. Chem. Int. Ed.* 1998, 37, 550 and Tang, W. C. *Proc. SPIE-Int. Soc. Opt. Eng.* 1997, 3224, 202. These endeavors should be particularly beneficial to the field of space exploration, where the use of nanoscale devices in space flight operations could reduce both the size and the mass of flight payloads and thus increase the overall cost-effectiveness of space flight missions. Recently, the construction of sub-microscale transistors has been achieved through the use of a technique called microcontact printing ($\mu$CP). "Bell Labs Researchers Use Miniature Rubber Stamps to Create Microscopic Devices" *Business Wire* Wednesday, Mar. 24, 1999, www.businesswire.com, 7:50 am. In this inexpensive alternative to photolithography as shown in FIG. 7, a metal-coated substrate is patterned with a poly(dimethylsiloxane) (PDMS) stamp that is inked with a solution of n-alkanethiol ($CH_3(CH_2)_nSH$). The alkanethiol chemisorbs onto the metal surface to form a self-assembled monolayer (SAM). The SAM pattern then acts as a wet chemical resist that protects the underlying metal as an etching solution removes any unprotected metal. Finally, the SAM is removed from the metal surface by treatment with ultraviolet (UV) radiation to yield a metal pattern on the substrate surface, which can serve as a sub-microscopic circuit.

The inventors describe an alternative methodology for the production of $\mu$CP-patterned electronic devices using SAMs derived from aliphatic dithiocarboxylic acids instead of n-alkanethiols. The advantages of this new approach arise from the newly discovered ability to remove SAMs generated from aliphatic dithiocarboxylic acids (ADTCAs, $CH_3(CH_2)_{n-1}CS_2H$) from the surface of gold with greater ease than SAMs generated from normal alkanethiols. The inventors have found that over the course of one week at room temperature and ambient relative humidity, ADTCA SAMs oxidize and desorb upon exposure to air. Furthermore, the decomposed SAMs were easily removed by rinsing with an appropriate solvent to reveal the underlying gold-coated substrate. Normal alkanethiol SAMs subjected to the same conditions showed no indication of oxidation and retained structural integrity (i.e., no desorption occurred). Hence, stripping of ADTCA SAMs from the surface of gold can be accomplished without the use of UV radiation.

In addition, the inventors have conducted the studies on the packing density and order of SAMs generated from a series of ADTCAs ($CH_3(CH_2)_{n-1}CS_2H$, n=9–17) using contact angle goniometry and polarization modulation infrared reflection absorption spectroscopy (PM-IRRAS). Colorado, R., Jr.; Villazana, R. J.; Lee, T. R. *Langmuir* 1998, 14, 6337. These experiments have been shown that these particular adsorbates generate as well-packed and as highly oriented monolayer films as the analogous n-alkanethiols. Furthermore, after being immersed in the etching solution for the time required to remove 20 nm of unprotected gold, neither the ADTCA SAMs nor the n-alkanethiol SAMs showed any deterioration from their pre-etched structures.[4] These results are significant since a key issue in microelectronic fabrication is to limit the number of defects per unit of area of a circuit. Therefore, the protective SAM formed on the gold surface must initially be of high quality and remain so throughout the etching process to ensure the generation of continuous and defect-free metal pathways.

The aforementioned preliminary experiments were all conducted using macroscopically patterned SAMs. In contrast, our future work will involve evaluating the quality of microscopic metal patterns generated by using ADTCA SAMs as the chemical resists. To this end, our most recent work has focused on the preparation of the PDMS stamps that will be used to pattern the metal surfaces with the SAMs. The templates used for the patterning of the stamps were copper scanning electron microscopy (SEM) grids (200 mesh) that yield a pattern of squares. The inventors have optimized the conditions for curing the polymer and removing the templates by etching with aqua regia, and can now produce stamps that are easily handled by hand. Using these conditions, the inventors can use other templates to vary the size and pattern of the holes. The quickness of the patterning, the reproducible quality of the patterns, and the robustness of the stamps are all attractive features that make this method very suitable for industrial application.

REFERENCES (1) Whitesides, G. M. *Sci. Am.* 1995, 9, 146.
(2) Lopez, G. P.; Albers, M. W.; Schreiber, S. L.; Caroll, R.; Peralta, E.; Whitesides, G. M. *J. Am. Chem. Soc.* 1993, 115, 5877.
(3) Wasserman, S. R.; Biebuyck, H. A.; Whitesides, G. M. *J. Mater. Res.* 1989, 4, 886.
(4) Prime, K. L.; Whitesides, G. M. *Science* 1991, 252, 1164.
(5) Singhvi, R.; Kumar, A.; Lopez, G. P.; Stephanopoulos, G. N.; Wang, D. I. C.; Whitesides, G. M.; Inber, D. E. *Science* 1994, 264, 696.
(6) DiMilla, P. A.; Folkers, J. P.; Biebuyck, H. A.; Harter, R.; Lopez, G. P.; Whitesides, G. M. *J. Am. Chem. Soc.* 1994, 116, 2225.
(7) Deng, L.; Mrksich, M.; Whitesides, G. M. *J. Am. Chem. Soc.* 1996, 118, 5136.
(8) Jennings, G. K.; Laibinis, P. E. *J. Am. Chem. Soc.* 1997, 119, 5208.
(9) Zamborini, F. P.; Campbell, J. K.; Crooks, R. M. *Langmuir* 1998, 14, 640.
(10) Calvert, J. M. *J. Vac. Sci. Technol. B.* 1993, 11, 2155.
(11) Kumar, A.; Whitesides, G. M. *Science* 1994, 263, 60.
(12) Xia, Y.; Zhao, X.-M.; Whitesides, G. M. *Microelectron. Eng.* 1996, 32, 255.
(13) Huang, Z.; Wang, P.-C.; MacDiarmid, A. G.; Xia, Y.; Whitesides, G. M. *Langmuir* 1997, 13, 6480.
(14) Ulman, A. *An Introduction to Ultrathin Organic Films*; Academic: Boston, 1991.
(15) Bain, C. D.; Whitesides, G. M. *Angew. Chem. Int. Ed. Engl.* 1989, 28, 506.
(16) Dubois, L. H.; Nuzzo, R. G. *Ann. Rev. Phys. Chem.* 1992, 43, 437.
(17) Ulman, A. *Chem. Rev.* 1996, 96, 1533.
(18) Chidsey, C. E. D.; Liu, G.-Y.; Rowntree, P.; Scoles, G. *J. Chem. Phys.* 1989, 91, 4421.
(19) Widrig, C. A.; Alves, C. A.; Porter, M. D. *J. Am. Chem. Soc.* 1991, 113, 2805.
(20) Laibinis, P. E.; Whitesides, G. M.; Allara, D. L.; Tao, Y.-T.; Parikh, A. N.; Nuzzo, R. G. *J. Am. Chem. Soc.* 1991, 113, 7152.
(21) Jaschke, M.; Schönherr, H.; Wolf, H.; Butt, H.-J.; Bamberg, E.; Besocke, M. K.; Ringsdorf, H. *J. Phys. Chem.* 1996, 100, 2290.
(22) Arndt, T.; Schupp, H.; Schrepp, W. *Thin Solid Films* 1989, 178, 319.
(23) Ihs, A.; Uvdal, K.; Liedberg, B. *Langmuir* 1993, 9, 733.
(24) A report of SAMs generated from non-chelating aliphatic thiocarboxylic acids has recently appeared: Tao, Y.-T.; Pandiaraju, S.; Lin, W.-L.; Chen, L.-J. *Langmuir* 1998, 14, 145.
(25) In some gold complexes, the dithiocarboxylate ligand is known to chelate to a single gold atom: Chiari, B.; Piovesana, O.; Tarantelli, T.; Zanazzi, P. F. *Inorg. Chem.*, 1985, 24, 371.
(26) Molecular modeling was performed using MMX force fields with PC Model V5.0: Serena Software, Bloomington, Ind.
(27) Alves, C. A.; Smith, E. L.; Porter, M. D. *J. Am. Chem. Soc.* 1992, 114, 1222.

(28) Houben, J.; Kesselkaul, L. *Ber. Dtsch. Chem. Ges.* 1902, 35, 3695.
(29) Ramadas, S. R.; Srinivasan, P. S.; Ramachandran, J.; Sastry, V. V. S. K. *Synthesis* 1983, 605.
(30) Houben, J.; Pohl, H. *Ber. Dtsch. Chem. Ges.* 1907, 40, 1725.
(31) Paquer, D. *Bull. Soc. Chem. Fr.* 1975, 1439.
(32) Porter, M. D.; Bright, T. B.; Allara, D. L.; Chidsey, C. E. D. *J. Am. Chem. Soc.* 1987, 109, 2358.
(33) Tao, Y.-T. *J. Am. Chem. Soc.* 1993, 115, 4350.
(34) Tao, Y.-T.; Lee, M.-T.; Chang, S.-C. *J. Am. Chem. Soc.* 1993, 115, 9547.
(35) Nuzzo, R. G.; Dubois, L. H.; Allara, D. L. *J. Am. Chem. Soc.* 1990, 112, 558.
(36) Huheey, J. E. *Inorganic Chemistry*; Harper Collins: Singapore, 1983.
(37) Purcell, K. F.; Kotz, J. C. *Inorganic Chemistry*; W. B. Saunders: Philadelphia, 1977.
(38) Patai, S. *The Chemistry of Carboxylic Acids and Esters*; Interscience: New York, 1969.
(39) Garg, N.; Lee, T. R. *Langmuir* 1998, 14, 3815.
(40) Shon, Y.-S.; Lee, T. R. *Langmuir*, submitted.
(41) Nuzzo, R. G.; Fusco, F. A.; Allara, D. L. *J. Am. Chem. Soc.* 1987, 109, 2358.
(42) Allara, D. L.; Nuzzo, R. G. *Langmuir* 1985, 1, 52.

All reference cited herein are incorporated by reference. While this invention has been described fully and completely, it should be understood that, within the scope of the appended claims, the invention may be practiced otherwise than as specifically described. Although the invention has been disclosed with reference to its preferred embodiments, from reading this description those of skill in the art may appreciate changes and modification that may be made which do not depart from the scope and spirit of the invention as described above and claimed hereafter.

What is claimed is:

1. A method for micro-contacting printing including:
   printing a pattern on a surface of a substrate, where the pattern includes exposed regions and self-assembled monolayer (SAM) protected regions, where the SAM comprises a dithiocarboxylic acid (DTCA) of the general formula (I):

$$(R)_\alpha\text{—}R'\text{—}(CS_2H)_\beta \qquad (I)$$

where:
   R is a carbon-containing group, a fluorinated carbon-containing group or a fluorocarbon-containing group;
   R' is a carbon-containing group, a multivalent atom, a double bond or hetero atom analog, a saturated, unsaturated, aromatic ring system or a hetero atom analog;
   $\alpha$ and $\beta$ are integers the sum of which is less than a maximum number of substituents R' can accommodate,
   coating the exposed base layer regions with a composition so that the surface comprises coated regions and the DTCA SAM protected regions; and
   removing the DTCA SAM from the protective regions under a mild oxidative environment, at ambient temperature in the absence or presence of UV radiation to form exposed surface regions and coated surface regions.

2. A method for micro-contacting printing including:
   contacting a substrate with a stamp comprising a stamp pattern including clean regions and regions comprising a dithiocarboxylic acid (DTCA) of the general formula (I):

$$(R)_\alpha\text{—}R'\text{—}(CS_2H)_\beta \qquad (I)$$

where:
   R is a carbon-containing group, a fluorinated carbon-containing group or a fluorocarbon-containing group;
   R' is a carbon-containing group, a multivalent atom, a double bond or hetero atom analog, a saturated, unsaturated, aromatic ring system or a hetero atom analog;
   $\alpha$ and $\beta$ are integers the sum of which is less than a maximum number of substituents R' can accommodate,
   to form a substrate pattern on the surface of the substrate corresponding to a negative of the stamp pattern, where the substrate pattern comprises DTCA SAM protected regions and DTCA SAM unprotected regions, and
   coating the exposed base layer regions with a composition so that the surface comprises coated regions and the DTCA SAM protected regions;
   removing the DTCA SAM from the protective regions under a mild oxidative environment, at ambient temperature in the absence or presence of UV radiation to form exposed surface regions and coated surface regions.

3. The method of claims 1 or 2, further comprising the steps of:
   repeating the printing, coating and removing steps to form a substrate comprising multiple patterned layers.

4. A method for micro-contacting printing including:
   printing a pattern on a top surface of a substrate including a base layer and a top layer, where the pattern includes exposed regions and self-assembled monolayer (SAM) protected regions, where the SAM comprises a dithiocarboxylic acid (DTCA) of the general formula (I):

$$(R)_\alpha\text{—}R'\text{—}(CS_2H)_\beta \qquad (I)$$

where:
   R is a carbon-containing group, a fluorinated carbon-containing group or a fluorocarbon-containing group;
   R' is a carbon-containing group, a multivalent atom, a double bond or hetero atom analog, a saturated, unsaturated, aromatic ring system or a hetero atom analog;
   $\alpha$ and $\beta$ are integers the sum of which is less than a maximum number of substituents R' can accommodate;
   removing the top layer from the exposed regions to form exposed base layer regions;
   coating the exposed base layer regions with a composition so that the surface comprises coated regions and the DTCA SAM protected regions; and
   removing the DTCA SAM from the protective regions under a mild oxidative environment, at ambient temperature in the absence or presence of UV radiation to form exposed top coat regions and coated base layer regions.

5. A method for micro-contacting printing including:
   contacting a substrate including a base layer and a top layer with a stamp comprising a stamp pattern including clean regions and regions comprising a dithiocarboxylic acid (DTCA) of the general formula (I):

$$(R)_\alpha\text{—}R'\text{—}(CS_2H)_\beta \qquad (I)$$

where:
- R is a carbon-containing group, a fluorinated carbon-containing group or a fluorocarbon-containing group;
- R' is a carbon-containing group, a multivalent atom, a double bond or hetero atom analog, a saturated, unsaturated, aromatic ring system or a hetero atom analog;
- $\alpha$ and $\beta$ are integers the sum of which is less than a maximum number of substituents R' can accommodate; and
- the DTCA SAM is characterized by reduced air and UV stability so that the DTCA SAM protected regions can be cleaned in a mild oxidative environment, at ambient temperature in the absence or presence of UV radiation, to form a top surface pattern on the substrate, where the top surface pattern corresponds to a negative of the stamp pattern and comprises DTCA SAM protected regions and DTCA SAM unprotected regions;

removing the top layer from the exposed regions to form exposed base layer regions; and removing the DTCA SAM from the protective regions under a mild oxidative environment, at ambient temperature in the absence or presence of UV radiation to form exposed top coat regions and coated base layer regions.

6. The method of claims 4 or 5, further comprising the step of:
prior to the second removing step, coating the exposed base layer regions with a composition so that the surface comprises coated regions and the DTCA SAM protected regions.

7. The method of claim 6, further comprising the steps of:
repeating the printing, removing, coating and removing steps to form a substrate comprising multiple patterned layers.

8. The method of claim 6, wherein $\alpha$ and $\beta$ are integers having a value of 1 or 2.

9. The method of claim 6, wherein R is selected from the group consisting of a linear carbon-containing group, a linear fluorinated carbon-containing group, and a linear fluorocarbon-containing group.

10. The method of claims 1, 2, 4 or 5, wherein $\alpha$ and $\beta$ are integers having a value of 1.

11. The method of claims 1, 2, 4 or 5, wherein $\alpha$ and $\beta$ are integers having a value of 2.

12. The method of claims 1, 2, 4 or 5, wherein R is a linear carbon-containing group, a linear fluorinated carbon-containing group or a linear fluorocarbon-containing group.

13. The method of claims 1, 2, 4 or 5, wherein R is a linear carbon-containing group.

14. The method of claims 1, 2, 4 or 5, wherein R is a linear fluorinated carbon-containing group.

15. The method of claims 1, 2, 4 or 5, wherein R is a linear fluorocarbon-containing group.

16. The method of claims 1, 2, 4 or 5, wherein R' is a carbon-containing group.

17. The method of claims 1, 2, 4 or 5, wherein R' is a multivalent atom.

18. The method of claims 1, 2, 4 or 5, wherein R' is a double bond or hetero atom analog thereof.

19. The method of claims 1, 2, 4 or 5, wherein R' is a saturated, unsaturated, aromatic ring system or a hetero atom analog thereof.

* * * * *